United States Patent
Shen et al.

[11] Patent Number: 5,789,951
[45] Date of Patent: Aug. 4, 1998

[54] MONOLITHIC CLAMPING CIRCUIT AND METHOD OF PREVENTING TRANSISTOR AVALANCHE BREAKDOWN

[75] Inventors: Zheng Shen, Chandler; Stephen P. Robb, Tempe, both of Ariz.

[73] Assignee: Motorola, Inc., Schaumburg, Ill.

[21] Appl. No.: 791,711

[22] Filed: Jan. 31, 1997

[51] Int. Cl.$^6$ ............................................. H03K 19/082
[52] U.S. Cl. .......................... 327/110; 327/434; 327/309
[58] Field of Search ........................... 327/108, 110, 327/306, 309, 312, 326, 51, 427, 380, 434; 257/328; 323/282, 283

[56] References Cited

U.S. PATENT DOCUMENTS

| | | | |
|---|---|---|---|
| 5,162,966 | 11/1992 | Fujihira | 257/140 |
| 5,304,802 | 4/1994 | Kumagai | 257/328 |
| 5,468,654 | 11/1995 | Harada | 437/6 |
| 5,491,404 | 2/1996 | Seettes et al. | 323/283 |
| 5,493,203 | 2/1996 | Dalton | 323/282 |
| 5,500,619 | 3/1996 | Miyasaka | 327/427 |
| 5,530,271 | 6/1996 | Fallica | 257/173 |

*Primary Examiner*—Timothy P. Callahan
*Assistant Examiner*—Dinh T. Le
*Attorney, Agent, or Firm*—Rennie William Dover; Robert D. Atkins

[57] ABSTRACT

A monolithic clamping circuit (10) and a method of protecting a semiconductor power transistor (14) from entering avalanche breakdown. The semiconductor power transistor (14) controls the switching of an inductor (16). The monolithic clamping circuit (10) causes energy stored in the inductor (16) to be dissipated in the semiconductor power transistor (14). A voltage sense circuit (18) provides a feedback signal to a selector circuit (12) in response to a voltage at a collector terminal of the semiconductor power transistor (14). The selector circuit (12) switches the semiconductor power transistor (14) to the conductive mode when the feedback signal indicates a high voltage at the collector terminal of the semiconductor power transistor (14). Dissipating the energy stored in the inductor (16) while operating in the conductive mode prevents the semiconductor power transistor (14) from entering avalanche breakdown.

14 Claims, 1 Drawing Sheet

1

MONOLITHIC CLAMPING CIRCUIT AND METHOD OF PREVENTING TRANSISTOR AVALANCHE BREAKDOWN

BACKGROUND OF THE INVENTION

The present invention relates, in general, to integrated circuits and, more particularly, to semiconductor power integrated circuits.

Several schemes have been used to protect a semiconductor transistor from potentially destructive voltages and currents which are commonly encountered in semiconductor power transistors used to switch inductive loads. When the semiconductor power transistor is switched off, the energy stored in the inductive load forces the voltage at the collector terminal of the semiconductor power transistor to rise above the supply voltage. If no limiting means are employed, this rise continues until an avalanche breakdown voltage of the semiconductor power transistor is reached, whereupon the energy stored in the inductor will be dissipated in the semiconductor power transistor. Such energy dissipation can cause stress-induced failure of the semiconductor power transistor.

A more manageable form of stress commonly occurs in the operation of semiconductor power transistors as they switch current on and off within their normal mode of conduction. Such operation of a semiconductor power transistor occurs when the current in the transistor is, and remains, under the control of the control terminal of the power transistor. In this state, the device conduction stress can be regulated by appropriately modulating the signal on the control terminal of the semiconductor power transistor. It is understood in the art of power transistor design that device avalanche breakdown stress is potentially more destructive than device conduction stress.

Accordingly, it would be advantageous to have an improved method of protecting a semiconductor transistor from avalanche breakdown stress. It would be of further advantage for the monolithic integrated semiconductor circuit to have self-protection when switching a current in an inductive load.

DETAILED DESCRIPTION OF THE DRAWINGS

Generally, the present invention provides a protection circuit for preventing destructive avalanche breakdown in a semiconductor power transistor used in, for example, an automotive ignition system. The protection circuit causes inductive energy stored in an inductor to be dissipated in the semiconductor power transistor while the transistor is biased in a forward conductive mode, thereby preventing the transistor from entering avalanche breakdown.

Figure 1:
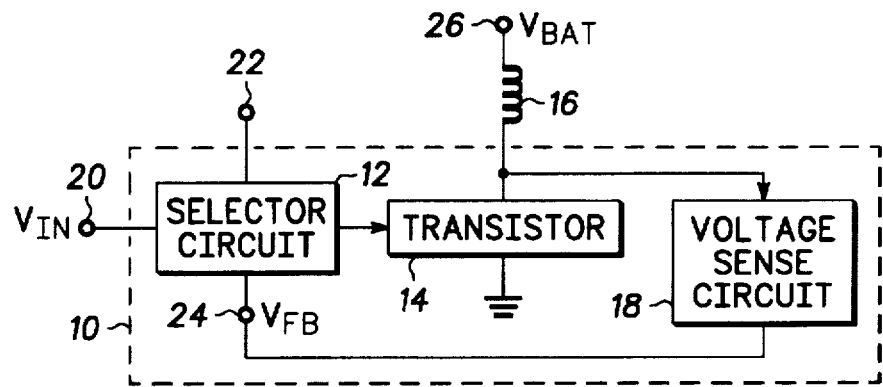
FIG. 1 is a block diagram of a monolithic clamping circuit in accordance with the present invention.

FIG. 1 is a block diagram of a monolithic clamping circuit 10 in accordance with the present invention. Monolithic clamping circuit 10 is also referred to as an avalanche breakdown protection circuit. Monolithic clamping circuit 10 has a selector circuit 12, a semiconductor power transistor 14, and a voltage sense circuit 18. In particular, selector circuit 12 has an input terminal 20 coupled for receiving an input signal, $V_{IN}$, a terminal 22 coupled for receiving a supply voltage, an input terminal 24 coupled for receiving a feedback signal, $V_{FB}$, and an output terminal. By way of example, input terminal 20 receives a signal from a microprocessor (not shown) for controlling the activation of monolithic clamping circuit 10 and terminal 22 receives a supply voltage of about three volts. Other suitable supply voltages include voltages of about five volts, twelve volts, etc. In other words, the voltage received at terminal 22 may be the voltage that powers the microprocessor or the voltage from, for example, an automobile battery.

Transistor 14 is a three terminal device having a control electrode and two current carrying electrodes. By way of example, transistor 14 is an Insulated Gate Bipolar Transistor (IGBT) having a gate terminal, a collector terminal, and an emitter terminal, wherein the collector and emitter terminals serve as the two current carrying electrodes. The gate terminal of transistor 14 is connected to the output terminal of selector circuit 12 and serves as the control electrode. The collector terminal of transistor 14 is coupled to a power supply terminal 26 through an externally connected inductor 16. Power supply terminal 26 is coupled for receiving a voltage such as, for example, twelve volts from an automotive battery. It should be noted that inductor 16 can have a secondary winding (not shown) that supplies energy to a device such as, for example, a spark plug in an automotive ignition system. The emitter terminal of transistor 14 is connected to a power supply terminal for receiving a voltage, such as ground potential.

Voltage sense circuit 18 receives an input signal from the node formed by the commonly connected collector of transistor 14 and a terminal of inductor 16. The output of voltage sense circuit 18 is connected to input terminal 24 of selector circuit 12 and provides the feedback signal, $V_{FB}$.

In operation, a logic one value received at input terminal 20 activates monolithic clamping circuit 10 by causing transistor 14 to operate in the conductive mode. The collector-to-emitter voltage of transistor 14 is typically less than about three volts while transistor 14 is operating in the conductive mode. The low voltage signal at the input of voltage sense circuit 18 causes the output of voltage sense circuit 18 to have a logic zero value. The feedback signal, $V_{FB}$, at input terminal 24 of selector circuit 12 having a logic zero value causes the output of selector circuit 12 to provide a voltage value to the gate terminal of transistor 14 that is above the threshold voltage of transistor 14. Thus, transistor 14 remains in the conductive mode.

When the signal at input terminal 20 transitions from a logic one to a logic zero value, the output of selector circuit 12 has a voltage value that is below the threshold voltage of transistor 14 which then switches from the conductive mode to the nonconductive mode. When transistor 14 switches from the conductive mode to the nonconductive mode, a voltage in the range of about three to five hundred volts is generated across inductor 16. A portion of the three to five hundred volts at the collector of transistor 14 is provided as a feedback signal, $V_{FB}$, by voltage sense circuit 18. By way of example, voltage sense circuit 18 receives an input voltage greater than three hundred volts and provides a feedback signal, $V_{FB}$, having a value of about fifty volts. The feedback signal of about fifty volts represents a logic one value that serves as an input to selector circuit 12. In response, selector circuit 12 provides an output voltage that is above the threshold voltage of transistor 14 which then switches from operating in the nonconductive mode to operating in the conductive mode. When transistor 14 operates in the conductive mode, the five hundred volts at the collector of transistor 14 is limited to less than the breakdown voltage of transistor 14. Monolithic clamping circuit 10 prevents transistor 14 from operating in the destructive avalanche breakdown mode when a high voltage is sensed on the collector terminal of transistor 14.

Figure 2:
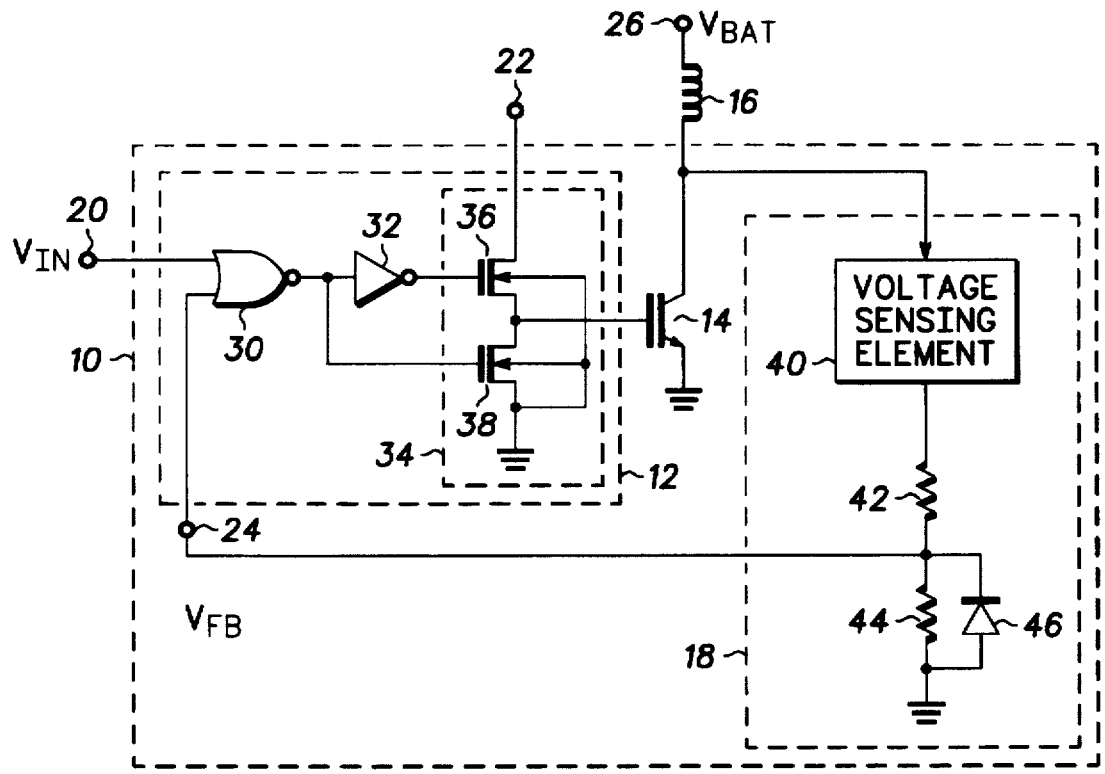
FIG. 2 is a schematic diagram of an embodiment of the monolithic clamping circuit of FIG. 1.

FIG. 2 is a schematic diagram of an embodiment of monolithic clamping circuit 10 of FIG. 1. In this embodiment, selector circuit 12 includes a two input NOR gate 30, an inverter 32, and a push-pull driver circuit 34. One input of NOR gate 30 is connected to input terminal 20 and the other input is connected to input terminal 24. The output of NOR gate 30 is connected to the input of inverter 32. Both the output of inverter 32 and the output of NOR gate 30 are connected to inputs of push-pull driver circuit 34. In particular, push-pull driver circuit 34 is comprised of N-channel Metal Oxide Semiconductor Field Effect Transistors-(MOSFETs) 36 and 38. MOSFETs 36 and 38 each have a gate terminal, a drain terminal, a source terminal, and a bulk or body terminal. The output of inverter 32 is connected to the gate terminal of MOSFET 36 and the output of NOR gate 30 is connected to the gate terminal of MOSFET 38. The drain terminal of MOSFET 36 serves as terminal 22 for receiving a supply voltage, such as VDD. It should be noted that NOR gate 30 and inverter 32 can also receive an operating voltage VDD. Alternatively, the drain terminal of MOSFET 36 is coupled to a supply voltage $V_{BAT}$ which may be supplied from an automobile battery. By way of example, supply voltage VDD has a value in the range of about three volts to five volts and supply voltage $V_{BAT}$ has a value of about twelve volts. The source of MOSFET 36 is connected to the drain of MOSFET 38 and serves as the output of both push-pull driver circuit 34 and selector circuit 12. The source terminal of MOSFET 38 is commonly connected to the body terminals of both MOSFETs 36 and 38 and the commonly connected terminals serve as a terminal for receiving a supply voltage such as, for example, ground potential.

The gate terminal of transistor 14 is connected to the output of selector circuit 12. The collector terminal of transistor 14 is coupled to a power supply terminal 26 through an externally connected inductor 16. Power supply terminal 26 is coupled for receiving a voltage such as, for example, twelve volts from an automotive battery. The emitter of transistor 14 is connected to a power supply terminal which is coupled for receiving a voltage such as, for example, ground potential. It should be noted that transistor 14 has been shown as an IGBT, but this is not intended as a limitation of the present invention. For instance, transistor 14 could be a metal oxide semiconductor field effect power transistor, a bipolar power transistor, or the like.

Voltage sense circuit 18 includes a voltage sensing element 40, a resistor 42, a resistor 44, and a clamp diode 46. In particular, an input of voltage sensing element 40 is commonly connected to the collector of transistor 14 and a terminal of inductor 16. It should be noted that voltage sensing element 40 can be either a resistor, a reverse biased PN junction diode, an open base bipolar transistor, or a Junction Field Effect Transistor (JFET) with a grounded gate terminal. An output of voltage sensing element 40 is connected to one terminal of resistor 42. The other terminal of resistor 42 is commonly connected to one terminal of resistor 44 and to the cathode of clamp diode 46, wherein the common connection serves as the output terminal of voltage sense circuit 18. The other terminal of resistor 44 is commonly connected to the anode of clamp diode 46 and serves as a power supply terminal for receiving a voltage such as, for example, ground potential. The output terminal of voltage sense circuit 18 is connected to input terminal 24 of selector circuit 12.

In operation, a logic one value supplied at input terminal 20 causes the output of NOR gate 30 to have a logic zero value and the output of inverter 32 to have a logic one value. The output signal of push-pull driver circuit 34 has a voltage value that is above the threshold voltage of transistor 14. The voltage value at the output of push-pull driver circuit 34 is the voltage supplied at terminal 22 less the drain-to-source voltage across MOSFET 36. The output of selector circuit 12 supplies a voltage to the gate terminal of transistor 14 that is above its threshold voltage causing transistor 14 to switch from operating in the nonconductive mode to operating in the conductive mode. The collector-to-emitter current of transistor 14 is approximately zero amps when it is operating in the nonconductive mode and about ten amps when it is operating in the conductive mode. The collector-emitter voltage of transistor 14 is less than about three volts when transistor 14 operates in the conductive mode.

The low voltage of less than about three volts at the input of voltage sensing element 40 is divided proportionately across voltage sensing element 40, resistor 42, and the parallel combination of clamp diode 46 and resistor 44. By way of example, voltage sensing element 40 is a reverse biased PN junction diode having a higher impedance than resistor 42 or 44. The voltage across the parallel combination of clamp diode 46 and resistor 44 is low and the output of voltage sense circuit 18 has a logic zero value.

When the signal at input terminal 20 transitions from a logic one value to a logic zero value, the output of NOR gate 30 has a logic one value and the output of inverter 32 has a logic zero value. The output of push-pull driver circuit 34 is below the threshold voltage of transistor 14 causing transistor 14 to operate in a nonconductive mode. The attempt to interrupt a current of about ten amps in inductor 16 causes a voltage spike or overshoot at the collector terminal of transistor 14. The voltage spike at the collector terminal of transistor 14 is in the range of several hundred volts.

Voltage sense circuit 18 provides a portion of the collector terminal voltage of transistor 14 as a feedback signal, $V_{FB}$, at input terminal 24. By way of example, the feedback signal can have a value of about fifty volts. Resistor values for resistors 42 and 44 are selected in accordance with the type of device used in voltage sensing element 40. When voltage sensing element 40 is a reversed biased PN junction diode, a significant portion of the voltage at the collector terminal of transistor 14 is dropped across the PN junction. By way of example, several hundred volts are dropped across voltage sensing element 40 when it is a reversed biased PN junction. When voltage sensing element 40 is a resistor a significant portion of the collector voltage of transistor 14 is dropped across resistor 42. The combined impedance of resistors 42 and 44 and voltage sensing element 40 is chosen to minimize the leakage current from voltage sense circuit 18. A high voltage at the input of voltage sensing element 40 causes the feedback signal, $V_{FB}$, at the output of voltage sense circuit 18 to have a value of about fifty volts. The high feedback voltage of about fifty volts represents a logic one value at the input of NOR gate 30. Clamp diode 46 limits the amplitude of the feedback signal voltage to prevent damaging the input to NOR gate 30. Thus, voltage sense circuit 18 senses a voltage in a range of four to five hundred volts at the collector terminal of transistor 14 and provides a feedback signal to selector circuit 12 that has a logic one value.

The feedback signal, $V_{FB}$, having a logic one value causes the output of NOR gate 30 to have a logic zero value and the output of inverter 32 to have a logic one value. The output of push-pull driver circuit 34 has a voltage value that is above the threshold voltage of transistor 14. Thus, selector circuit 12 generates a bias voltage that is above a threshold voltage for transistor 14 when the feedback signal is a logic one value, thereby switching the transistor from a nonconductive mode to a conductive mode and preventing transistor 14 from entering avalanche breakdown. The high voltage at the collector terminal of transistor 14 is limited by transistor 14 operating in the conductive mode. It should be noted that transistor 14 operates in the conductive mode to hold the collector voltage of transistor 14 constant at a voltage that is below the breakdown voltage of transistor 14.

The feedback signal to selector circuit 12 has a logic zero value when the voltage at the collector terminal of transistor 14 has been reduced to less than about three volts. Selector circuit 12 generates a bias voltage at the gate terminal of transistor 14 that is below the threshold voltage for transistor 14 when the feedback signal has a logic zero value. Thus, transistor 14 switches from the conductive mode to the nonconductive mode. Monolithic clamping circuit 10 continues to operate with transistor 14 in the nonconductive mode until being activated by a logic one value at input terminal 20.

By now it should be appreciated that the present invention provides a circuit for switching inductive loads and protecting a semiconductor power transistor from destructive avalanche breakdown stress. A monolithic integrated semiconductor circuit detects a high collector voltage resulting from the inductive energy as the power transistor switches from the conductive to the nonconductive mode. The high collector voltage is fed back to a selector circuit that forces the power transistor to momentarily operate in the conductive mode, thereby safely dissipating the inductive energy and protecting the power transistor from avalanche breakdown stress.

While specific embodiments of the present invention have been shown and described, further modifications and improvements will occur to those skilled in the art. For instance, FIGS. 1 and 2 show the feedback signal generated by voltage sense circuit 18 being an input to selector circuit 12. In an alternative embodiment, the feedback signal could also be a flag input signal to a microprocessor (not shown). It is understood that the invention is not limited to the particular forms shown and it is intended for the appended claims to cover all modifications which do not depart from the spirit and scope of this invention.

We claim:

1. A monolithic clamping circuit, comprising:

a transistor having a control electrode, a first current carrying electrode, and a second current carrying electrode;

a voltage sense circuit having an input and an output, wherein the input is coupled to the second current carrying electrode of the transistor; and a selector circuit having a first input coupled for receiving a signal, a second input coupled to the output of the voltage sense circuit, and an output coupled to the control electrode of the transistor, wherein the selector circuit includes, (a) a NOR gate having a first input, a second input, and an output, wherein the first input of the NOR gate serves as the first input of the selector circuit and the second input of the NOR gate serves as the second input of the selector circuit, (b) an inverter having an input and an output, wherein the input of the inverter is coupled to the output of the NOR gate, and (c) a push-pull driver circuit having a first input, a second input, and an output, wherein the first input is coupled to the output of the inverter, the second input is coupled to the output of the NOR gate, and the output of the push-pull driver circuit serves as the output of the selector circuit.

2. The monolithic clamping circuit of claim 1, wherein the push-pull driver circuit further comprises:

a first transistor having a gate terminal, a drain terminal, and a source terminal, wherein the gate terminal of the first transistor serves as the first input of the push-pull driver circuit; and a second transistor having a gate terminal, a drain terminal, and a source terminal, wherein the gate terminal of the second transistor serves as the second input of the push-pull driver circuit, and the drain terminal of the second transistor is coupled to the source terminal of the first transistor and serves as the output node of the push-pull driver circuit.

3. The monolithic clamping circuit of claim 2, wherein the first transistor and the second transistor are N-channel Metal Oxide Semiconductor Field Effect Transistors (MOSFETs).

4. The monolithic clamping circuit of claim 1, wherein the transistor is an Insulated Gate Bipolar Transistor (IGBT).

5. The monolithic clamping circuit of claim 1, wherein the transistor is a bipolar power transistor.

6. The monolithic clamping circuit of claim 1, wherein the transistor is a metal oxide semiconductor field effect power transistor.

7. The monolithic clamping circuit of claim 1, wherein the voltage sense circuit further comprises:

a voltage sensing element having a first terminal and a second terminal, wherein the first terminal of the voltage sensing element serves as the input of the voltage sense circuit;

a first resistor having a first terminal and a second terminal, wherein the first terminal of the first resistor is coupled to the second terminal of the voltage sensing element;

a second resistor having a first terminal and a second terminal, wherein the first terminal of the second resistor is coupled to the second terminal of the first resistor; and a clamp diode having an anode and a cathode, wherein the cathode is commonly coupled to the first terminal of the second resistor and serves as the output of the voltage sense circuit, and the anode is coupled to the second terminal of the second resistor.

8. The monolithic clamping circuit of claim 7, wherein the voltage sensing element is a resistor.

9. The monolithic clamping circuit of claim 7, wherein the voltage sensing element is a reverse biased PN junction diode, an anode of the reverse biased PN junction diode is the first terminal of the voltage sensing element.

10. The monolithic clamping circuit of claim 7, wherein the voltage sensing element is an open base bipolar transistor having a control electrode, a first current carrying electrode, and a second current carrying electrode, the first current carrying electrode is the first terminal of the voltage sensing element and the second current carrying electrode is the second terminal of the voltage sensing element.

11. The monolithic clamping circuit of claim 7, wherein the voltage sensing element is a Junction Field Effect Transistor (JFET) having a gate terminal, a drain terminal, and a source terminal, the drain terminal is the first terminal of the voltage sensing element, the source terminal is the second terminal of the voltage sensing element, and the gate terminal is grounded.

12. An avalanche breakdown protection circuit, comprising:

an Insulated Gate Bipolar Transistor (IGBT) having a gate terminal, a collector terminal, and an emitter terminal;

a voltage sensing element having an input and an output, wherein the input is coupled to the collector terminal of the Insulated Gate Bipolar Transistor (IGBT);

a clamp diode having an anode and a cathode, wherein the cathode is coupled to the output of the voltage sensing element; and a selector circuit having a first input, a second input, and an output, wherein the first input is coupled to the cathode of the clamp diode and the output is coupled to the gate terminal of the Insulated Gate Bipolar Transistor (IGBT), the selector circuit further including, (a) a NOR gate having a first input, a second input, and an output, wherein the first input of the NOR gate serves as the first input of the selector circuit, and the second input of the NOR gate serves as the second input of the selector circuit, (b) an inverter having an input and an output, wherein the input of the inverter is coupled to the output of the NOR gate, and (c) a push-pull driver circuit having a first input, a second input, and an output node, wherein the first input is coupled to the output of the inverter, the second input is coupled to the output of the NOR gate, and the output node of the push-pull driver circuit serves as the output of the selector circuit.

13. The avalanche breakdown protection circuit of claim 12, wherein the push-pull driver circuit further comprises:

a first transistor having a gate terminal, a drain terminal, and a source terminal, wherein the gate terminal of the first transistor serves as the first input of the push-pull driver circuit; and a second transistor having a gate terminal, a drain terminal, and a source terminal, wherein the gate terminal of the second transistor serves as the second input of the push-pull driver circuit, and the drain terminal of the second transistor is coupled to the source terminal of the first transistor and serves as the output node of the push-pull driver circuit.

14. The avalanche breakdown protection circuit of claim 13, wherein the first transistor and the second transistor are N-channel Metal Oxide Semiconductor Field Effect Transistors (MOSFETs).

* * * * *

UNITED STATES PATENT AND TRADEMARK OFFICE
CERTIFICATE OF CORRECTION

PATENT NO. :   5,789,951
DATED      :   August 4, 1998
INVENTOR(S) :  Zheng Shen et al.

It is certified that error appears in the above-identified patent and that said Letters Patent is hereby corrected as shown below:

In column 6, claim 2, line 17, delete "node".

Signed and Sealed this

Twenty-ninth Day of September, 1998

Attest:

BRUCE LEHMAN

*Attesting Officer*    Commissioner of Patents and Trademarks